United States Patent
Yoder et al.

(10) Patent No.: US 7,598,123 B2
(45) Date of Patent: Oct. 6, 2009

(54) SEMICONDUCTOR COMPONENT AND METHOD OF MANUFACTURE

(75) Inventors: Jay A. Yoder, Phoenix, AZ (US); Joseph K. Fauty, Mesa, AZ (US); James P. Letterman, Mesa, AZ (US)

(73) Assignee: Semiconductor Components Industries, L.L.C., Phoenix, AZ (US)

( * ) Notice: Subject to any disclaimer, the term of this patent is extended or adjusted under 35 U.S.C. 154(b) by 283 days.

(21) Appl. No.: 11/681,500

(22) Filed: Mar. 2, 2007

(65) Prior Publication Data
US 2008/0217765 A1 Sep. 11, 2008

(51) Int. Cl.
*H01L 21/00* (2006.01)
(52) U.S. Cl. .......... 438/112; 438/108; 438/109; 257/686; 257/723; 257/777; 257/796; 257/E21.506; 257/E23.034; 257/E23.066; 257/E23.116
(58) Field of Classification Search .......... 257/777, 257/E23.066, 686, 723, 796, E21.506, E23.034, 257/E23.116; 438/112, 108, 109
See application file for complete search history.

(56) References Cited

U.S. PATENT DOCUMENTS

| | | | |
|---|---|---|---|
| 6,677,672 B2 | 1/2004 | Knapp et al. | |
| 6,737,750 B1 * | 5/2004 | Hoffman et al. | 257/777 |
| 2004/0041279 A1 * | 3/2004 | Fuller et al. | 257/782 |
| 2004/0089955 A1 * | 5/2004 | Zhou | 257/787 |
| 2004/0259288 A1 * | 12/2004 | Mostafazadeh et al. | 438/106 |
| 2005/0090050 A1 * | 4/2005 | Shim et al. | 438/200 |
| 2006/0197207 A1 * | 9/2006 | Chow et al. | 257/686 |

* cited by examiner

*Primary Examiner*—Tu-Tu V Ho
(74) *Attorney, Agent, or Firm*—Rennie William Dover

(57) ABSTRACT

A semiconductor component comprising two stacked semiconductor dice and a method of manufacture. A leadframe having an active area that includes leadframe leads and a cavity is mounted to a support material such as an adhesive tape. A packaged semiconductor die that includes a first semiconductor die mounted to a support structure and encapsulated within a mold compound is mounted on the adhesive tape. A second semiconductor die is mounted to the packaged semiconductor die. Bond pads on the second semiconductor die are electrically connected to the leadframe, the support structure on which the first semiconductor die is mounted, or both. A mold compound is formed around the second semiconductor die, portions of the leadframe, and the packaged semiconductor die. The adhesive tape is removed and the leadframe is singulated to form multi-chip packages.

20 Claims, 10 Drawing Sheets

SEMICONDUCTOR COMPONENT AND METHOD OF MANUFACTURE

FIELD OF THE INVENTION

The present invention relates, in general, to semiconductor component packaging and, more particularly, to semiconductor components containing more than one semiconductor chip or package.

BACKGROUND OF THE INVENTION

In general, semiconductor component manufacturers consider criteria such as size, weight, power consumption, and functionality when designing and manufacturing their products. Increasing the functionality of the semiconductor components typically increases their size, weight, and power consumption. One approach for increasing functionality while limiting the degradation of other design criteria has been to integrate devices based on different technologies in a single package. This mixed die approach includes the placement of two or more bare semiconductor dice on a substrate such as a multi-level printed circuit board or a leadframe. The substrate and the semiconductor dice are then covered with a lid or encapsulant to form a Multi-chip Module ("MCM"). For example, one semiconductor die may be a drive transistor and the other semiconductor die may be an analog voltage regulator switch. A drawback with this approach is that the drive transistor may use a wire bond capable of carrying large currents, e.g., aluminum or an aluminum alloy, whereas the analog voltage regulator may use a wire bond more suitable for fast signal transmission and low attenuation, e.g., gold or a gold alloy. These two types of wire bonds are difficult to manufacture using mixed dice.

Another approach for manufacturing an MCM is to place a molded or encapsulated semiconductor die on a printed circuit board substrate and place a bare die on another portion of the printed circuit board substrate. A drawback with this technique is the complexity and cost of manufacturing signal traces on the printed circuit board substrate suitable for wire bonding to the bare semiconductor die and soldering the leadframe leads of the encapsulated semiconductor die to the printed circuit board.

Accordingly, it would be advantageous to have an MCM and a method for manufacturing the MCM comprising at least one bare semiconductor die. It would be of further advantage for the MCM to be cost efficient to manufacture.

BRIEF DESCRIPTION OF THE DRAWINGS

The present invention will be better understood from a reading of the following detailed description, taken in conjunction with the accompanying drawing figures in which like reference characters designate like elements and in which.

DETAILED DESCRIPTION

Generally, the present invention provides semiconductor components comprising a plurality of semiconductor dice and a method for manufacturing the semiconductor components. In accordance with an embodiment of the present invention, a leadframe having at least one opening is mounted to an adhesive material such as, for example, a mold tape. The opening exposes a portion of the adhesive material. An encapsulated semiconductor component is mounted to the portion of the adhesive material exposed by the opening. The encapsulated semiconductor component is also referred to as a packaged semiconductor die. A bare semiconductor die is then attached to the encapsulated semiconductor component. Wire bonds are formed between bond pads on the bare semiconductor die and leadframe leads. A single wire bond may be formed between a bond pad and a leadframe lead or a plurality of bond pads may be connected to a single leadframe lead using a plurality of wire bonds. In other words, a wire bond extends from one bond pad to a leadframe lead and a wire bond extends from a different bond pad to the leadframe lead.

In accordance with another embodiment, two bare semiconductor dice are attached to the semiconductor component. Bond pads on the bare semiconductor dice are wire bonded to corresponding leadframe leads.

In accordance with another embodiment, one or more of the bond pads on the bare semiconductor die is wire bonded to a lead extending from the encapsulated semiconductor component. Mounting a bare semiconductor die to an encapsulated semiconductor die decreases mechanical stacking stresses common to the traditional bare die stacking platforms. In addition, damage to wire bonds is reduced because one of the semiconductor dice has already been encapsulated in a mold compound. Mounting one or more semiconductor dice to a packaged semiconductor component also precludes the need for using advanced "low loop" wire bonding designs.

Figure 1:
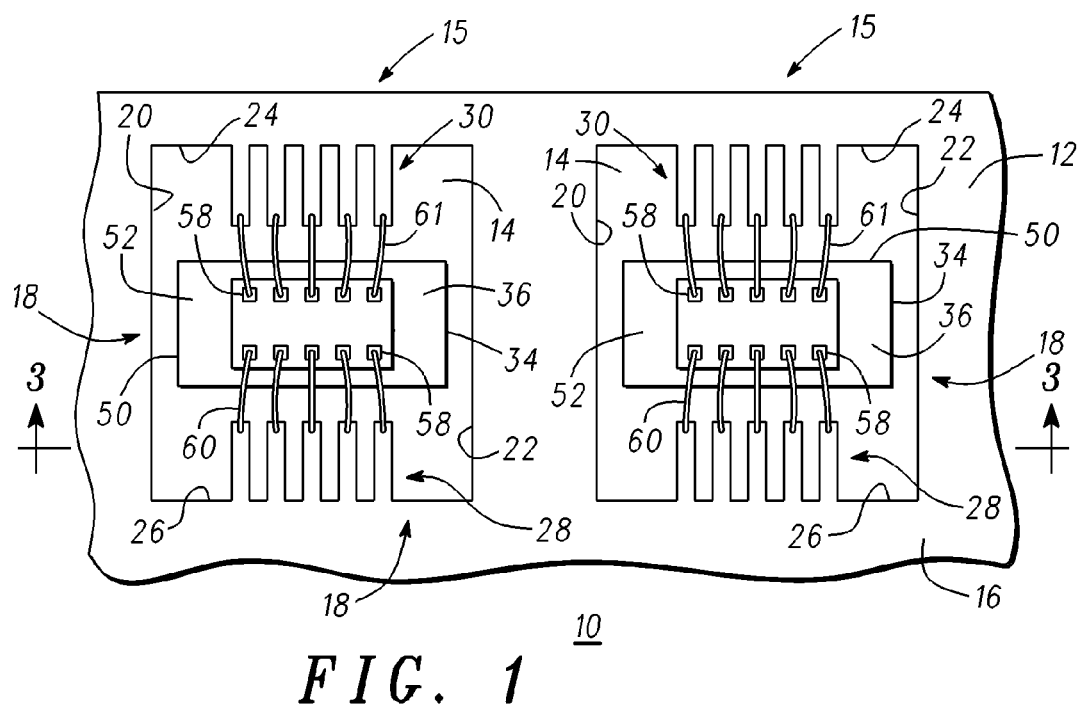
FIG. 1 is a top view of a semiconductor component during manufacture in accordance with an embodiment of the present invention.

FIG. 1 is a top view of a semiconductor component 10 during manufacture in accordance with an embodiment of the present invention. What is shown in FIG. 1 is a leadframe 12 mounted on an adhesive tape 14. Leadframe 12 has a top surface 16, cavities 18 having opposing sides 20 and 22, and opposing sides 24 and 26. A plurality of leadframe leads 28 extend from side 26 and a plurality of leadframe leads 30 extend from side 24. It should be understood that the number of leadframe leads making up plurality of leadframe leads 28 and the number of leadframe leads making up plurality of leadframe leads 30 are not limitations of the present invention. It should be further understood that leadframe 12 includes a plurality of active areas from which semiconductor components are formed and that FIG. 1 illustrates two active areas 15. A suitable material for adhesive tape 14 is a mold tape comprising polyimide, polyester, or the like. By way of example, adhesive tape 14 is a Bron Tape CT908 mold tape and leadframe 12 is copper having a thickness ranging from about 5 mils (about 127 micrometers) to about 25 mils (about 635 micrometers). Techniques for forming leadframe leads are known to those skilled in the art.

Figure 2:
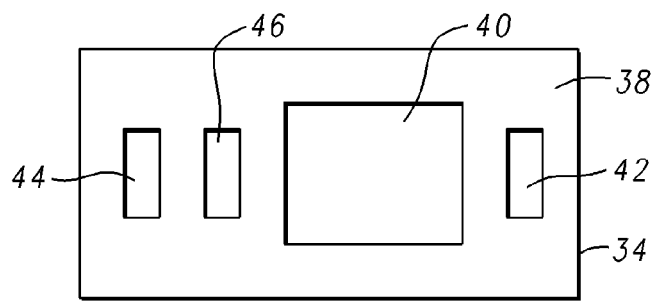
FIG. 2 is a bottom view of a portion of the semiconductor component of FIG. 1.

Molded semiconductor components are mounted on portions of adhesive tape 14 that are exposed by cavities 18. More particularly, a semiconductor component 34 is mounted between leadframe leads 28 and 30 in each active area 15. In accordance with one embodiment, semiconductor component 34 is comprised of a semiconductor die mounted on a leadframe, wherein the semiconductor die and a portion of the leadframe are encapsulated within a mold compound. Semiconductor component 34 is also referred to as a packaged semiconductor die and the leadframe on which the semiconductor die is mounted is also referred to as a support. The mold compound encapsulating the semiconductor die is also referred to as a protective material. Briefly referring to FIGS. 1 and 2, semiconductor component 34 has a top surface 36, a bottom surface 38, a source conductor 40, a gate conductor 42, and drain conductors 44 and 46. It should be noted that FIG. 1 illustrates a top view of semiconductor component 34 and FIG. 2 illustrates a bottom view of semiconductor component 34.

Figure 3:
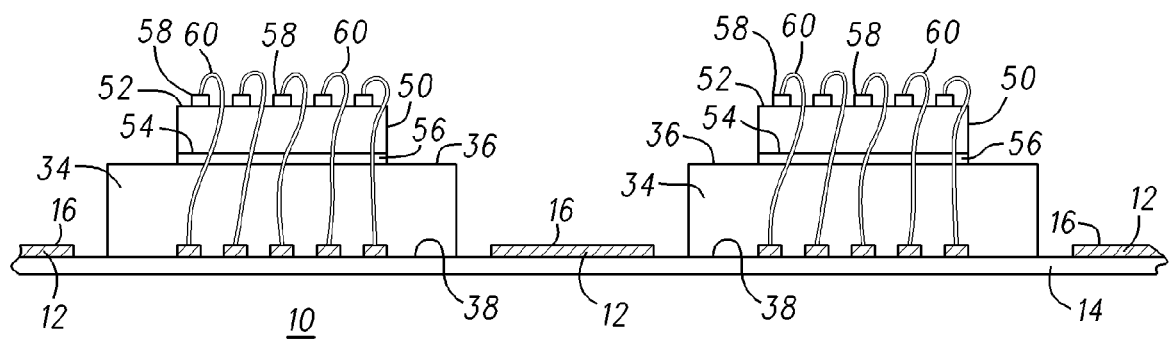
FIG. 3 is a cross-sectional view of the semiconductor component taken along section line 3-3 of FIG. 1.

With reference to FIGS. 1 and 3, a semiconductor die 50 is attached to each molded semiconductor component 34 through a die attach material 56. Each semiconductor die 50 has a top or active surface 52 and a bottom or mating surface 54. It should be noted that FIG. 3 is a cross-sectional view taken along section line 3-3 of FIG. 1. A plurality of bond pads 58 is disposed on active surface 52. Mating surface 54 is placed in die attach material 56 which is disposed on surface 36 of molded semiconductor component 34. Suitable materials for die attach material 56 include epoxy, polyimide, a thermoplastic paste, a thermoplastic film, or the like. Die attach material 56 can be dispensed onto the surface of molded semiconductor component 34 or laminated to the back of semiconductor die 50 and B-stage cured.

Bond wires 60 and 61 connect leadframe leads 28 and 30, respectively, to corresponding bond pads 58. Preferably, a single bond wire connects a leadframe lead to a corresponding bond pad. However, this is not a limitation of the present invention. For example, one or more bond pads may be connected to a single leadframe lead. Bond wires are also referred to as wire bonds. Techniques for forming bond wires are known to those skilled in the art.

Figure 4:
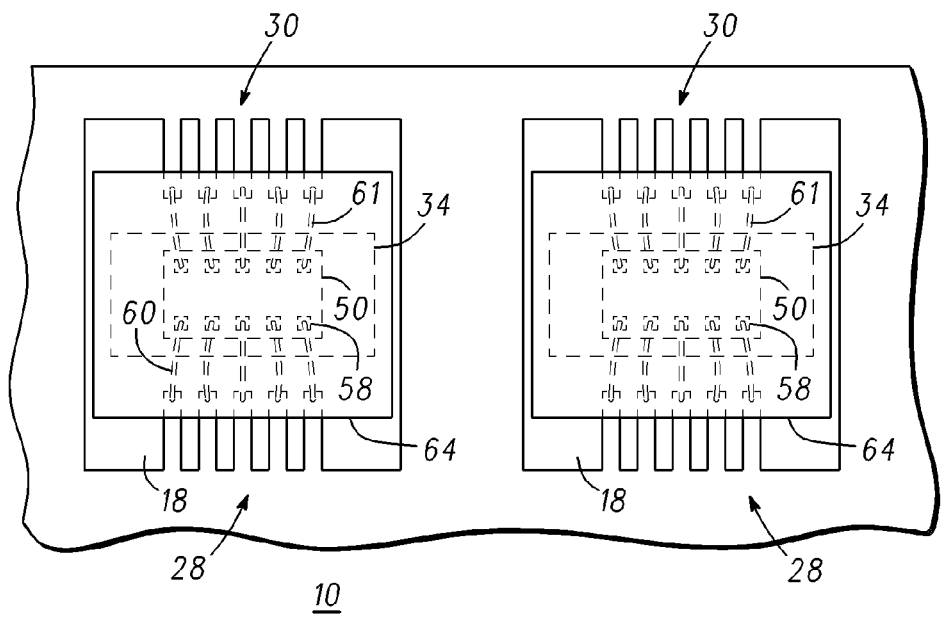
FIG. 4 is a top view of the semiconductor component of FIG. 1 during a later stage of manufacture.

As described with reference to FIG. 1, leadframe 12 typically includes a plurality of active areas from which semiconductor components are manufactured. After forming the bond wires, each active area is encapsulated in a mold compound that protects the semiconductor components from physical and environmental stresses. The individual semiconductor components are then singulated from the leadframe. FIG. 4 is a top view of semiconductor component 10 after molded semiconductor component 34, semiconductor die 50, bond pads 58, bond wires 60 and 61, and portions of leadframe leads 28 and 30 have been encapsulated by a mold compound 64. These elements may be encapsulated in mold compound 64 using a transfer molding technique. After encapsulation by mold compound 64, adhesive tape 14 is removed. Adhesive tape 14 is also referred to as a temporary support because it is removed after encapsulation by mold compound 64. It should be noted that semiconductor component 34, wire bonds 60 and 61, the portions of leadframe leads 28 and 30 that are encapsulated within mold compound 64 are shown as broken lines because they are hidden from view by mold compound 64.

Figure 5:
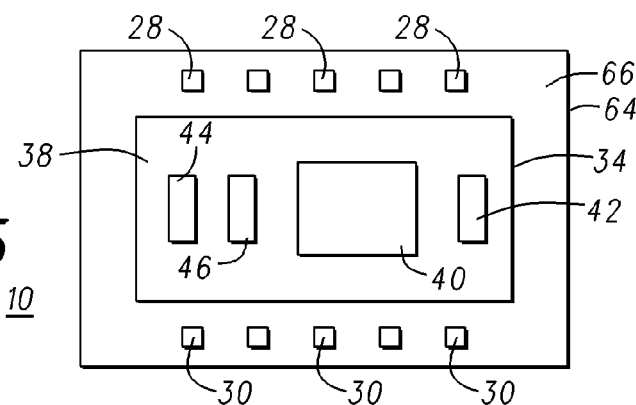
FIG. 5 is a bottom view the semiconductor component of FIG. 4 after singulation.

FIG. 5 is a bottom view of semiconductor component 10 after singulation. What is shown in FIG. 5 is bottom surface 66 of mold compound 64, leadframe leads 28 and 30, and bottom surface 38 of molded semiconductor component 34 including source conductor 40, a gate conductor 42, and drain conductors 44 and 46. Thus, semiconductor component 10 includes two semiconductor dice in a single semiconductor package. Semiconductor component 10 is referred to as being in a single stack configuration because a single semiconductor die is mounted on molded semiconductor component 34.

Figure 6:
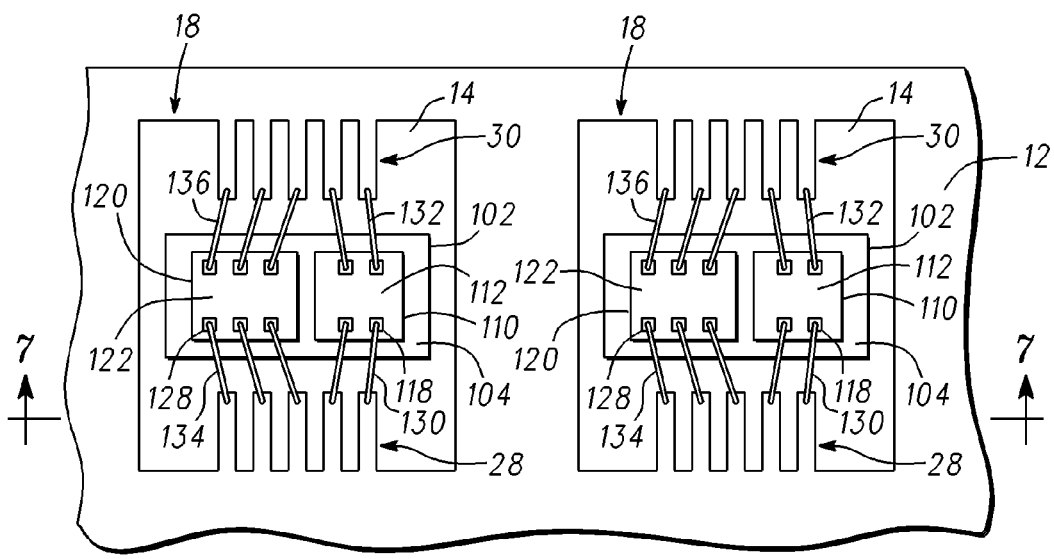
FIG. 6 is a top view of a semiconductor component during manufacture in accordance with another embodiment of the present invention.

FIG. 6 is a top view of a semiconductor component 100 during manufacture in accordance with another embodiment of the present invention. What is shown in FIG. 6 is leadframe 12 mounted on an adhesive tape 14. Leadframe 12 and adhesive tape 14 have been described with reference to FIG. 1. A molded semiconductor component 102 is mounted on a portion of adhesive tape 14 that is exposed by cavity 18. More particularly, molded semiconductor component 102 is mounted between leadframe leads 28 and 30. Molded semiconductor component 102 may comprise a semiconductor die mounted on a leadframe, wherein the semiconductor die and a portion of the leadframe are encapsulated within a mold compound. Similar to molded semiconductor component 34, molded semiconductor component 102 includes a top surface 104, a bottom surface 106 (shown in FIG. 7), and conductors exposed through bottom surface 106.

Figure 7:
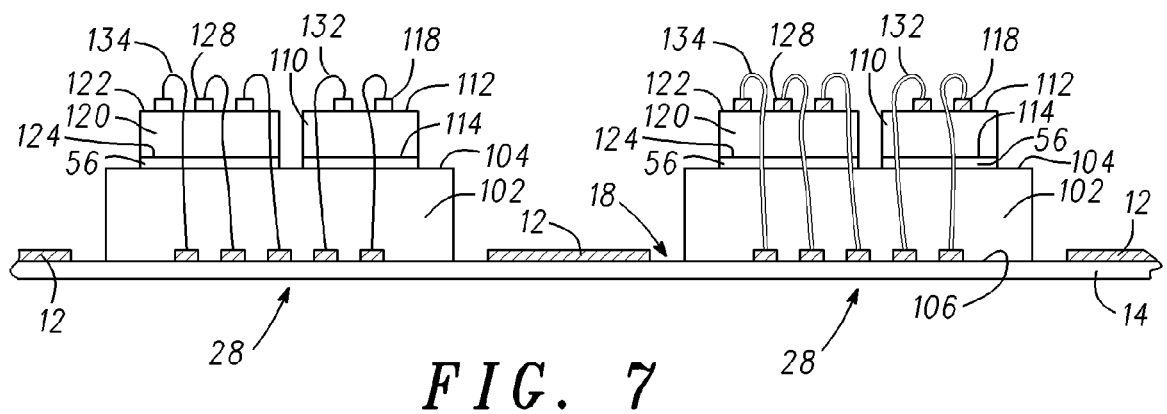
FIG. 7 is a cross-sectional view of the semiconductor component taken along section line 7-7 of FIG. 6.

With reference to FIGS. 6 and 7, a semiconductor die 110 having a top or active surface 112 and a bottom or mating surface 114 is attached to molded semiconductor component 102 through a die attach material 56. It should be noted that FIG. 7 is a cross-sectional view taken along section line 7-7 of FIG. 6. A plurality of bond pads 118 is disposed on active surface 112. Mating surface 114 is placed in die attach material 56 which is disposed on surface 104 of molded semiconductor component 102. In addition, a semiconductor die 120 having a top or active surface 122 and a bottom or mating surface 124 is attached to molded semiconductor component 102 through die attach material 56. A plurality of bond pads 128 is disposed on active surface 122. Mating surface 124 is placed in die attach material 56 which is disposed on surface 104 of molded semiconductor component 102. Die attach material 56 is then cured. Semiconductor component 100 is referred to as being in a double stack configuration because two semiconductor dice are mounted on packaged semiconductor component 102.

Bond wires 130 and 132 connect leadframe leads 28 and 30, respectively, to corresponding bond pads 118 on semiconductor die 110 and bond wires 134 and 136 connect leadframe leads 28 and 30, respectively, to corresponding bond pads 128 on semiconductor die 120. Preferably, a single bond wire connects a leadframe lead to a corresponding bond pad. However, this is not a limitation of the present invention. For example, one or more bond pads may be connected to a single leadframe lead. Bond wires are also referred to as wire bonds. Techniques for forming bond wires are known to those skilled in the art.

Figure 8:
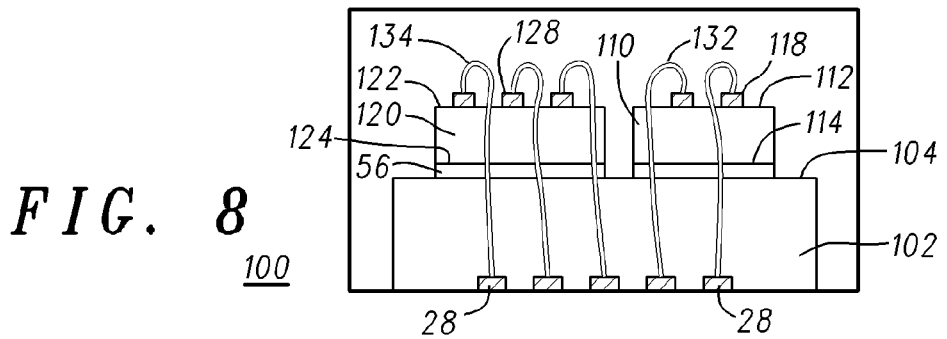
FIG. 8 is a cross-sectional view of the semiconductor component of FIG. 7 after singulation.

FIG. 8 is a cross-sectional view of semiconductor component 100 after encapsulation in a mold compound 140 and singulation.

Figure 9:
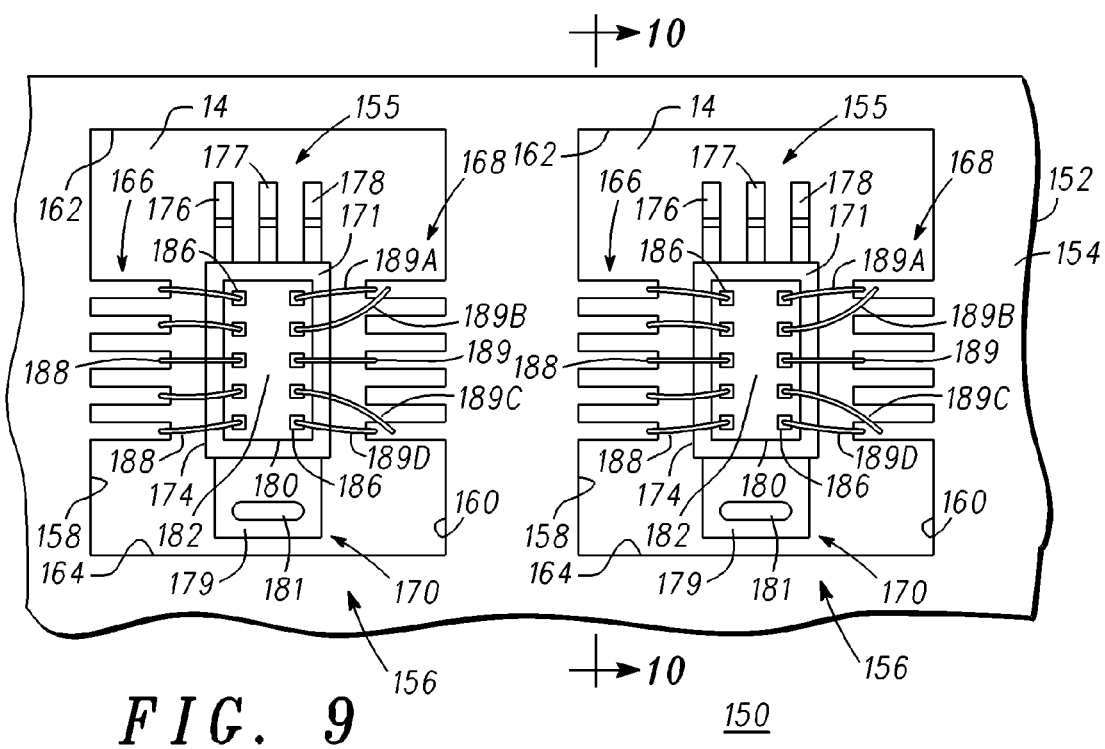
FIG. 9 is a top view of a semiconductor component during manufacture in accordance with another embodiment of the present invention.

FIG. 9 is a top view of a semiconductor component 150 during manufacture in accordance with another embodiment of the present invention. What is shown in FIG. 9 is a leadframe 152 mounted on adhesive tape 14. Leadframe 152 has a top surface 154 and cavities 156 having opposing sides 158 and 160 and opposing sides 162 and 164. A plurality of leadframe leads 166 extend from side 158 and a plurality of leadframe leads 168 extend from side 160. It should be understood that the number of leadframe leads comprising plurality of leadframe leads 166 and the number of leadframe leads comprising plurality of leadframe leads 168 are not limitations of the present invention. Like leadframe 12, leadframe 152 includes a plurality of active areas from which semiconductor components are formed. FIG. 9 illustrates two active areas 155. By way of example, leadframe 152 is copper having a thickness ranging from about 5 mils (about 127 micrometers) to about 25 mils (about 635 micrometers). Techniques for forming leadframe leads are known to those skilled in the art.

A molded semiconductor component 170 is mounted on a portion of adhesive tape 14 that is exposed by cavity 156. More particularly, semiconductor component 170 is mounted between leadframe leads 166 and 168. In accordance with one embodiment, molded semiconductor component 170 comprises a semiconductor die mounted on a leadframe, wherein the semiconductor die and a portion of the leadframe are encapsulated within a mold compound 174. Leadframe leads 176, 177, and 178 extend from one side of mold compound 174 and a leadframe lead 179 extends from an opposing side of mold compound 174. Leadframe lead 179 has a hole or opening 181.

Figure 10:
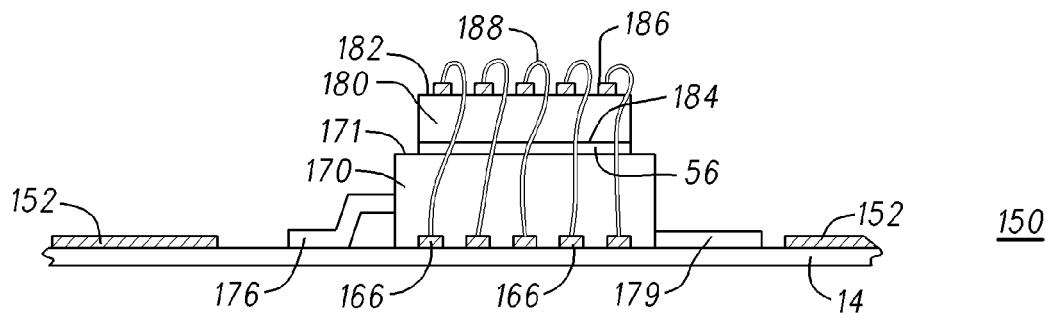
FIG. 10 is a cross-sectional view of the semiconductor component taken along section line 10-10 of FIG. 9.

A semiconductor die 180 having a top or active surface 182 and a bottom or mating surface 184 is attached to molded semiconductor component 170 through a die attach material 56. It should be noted that FIG. 10 is a cross-sectional view taken along section line 10-10 of FIG. 9. A plurality of bond pads 186 is disposed on active surface 182. Mating surface 184 is placed in die attach material 56 which is disposed on a top surface 171 of molded semiconductor component 170. Die attach material 56 is then cured.

Bond wires 188 connect leadframe leads 166 to corresponding bond pads 186 and bond wires 189 connect leadframe leads 168 to corresponding bond pads 186. Bond wires 189A and 189B connect two bond pads to a single leadframe lead 168 and bond wires 189C and 189D connect two bond pads to a single leadframe lead 168.

Figure 11:
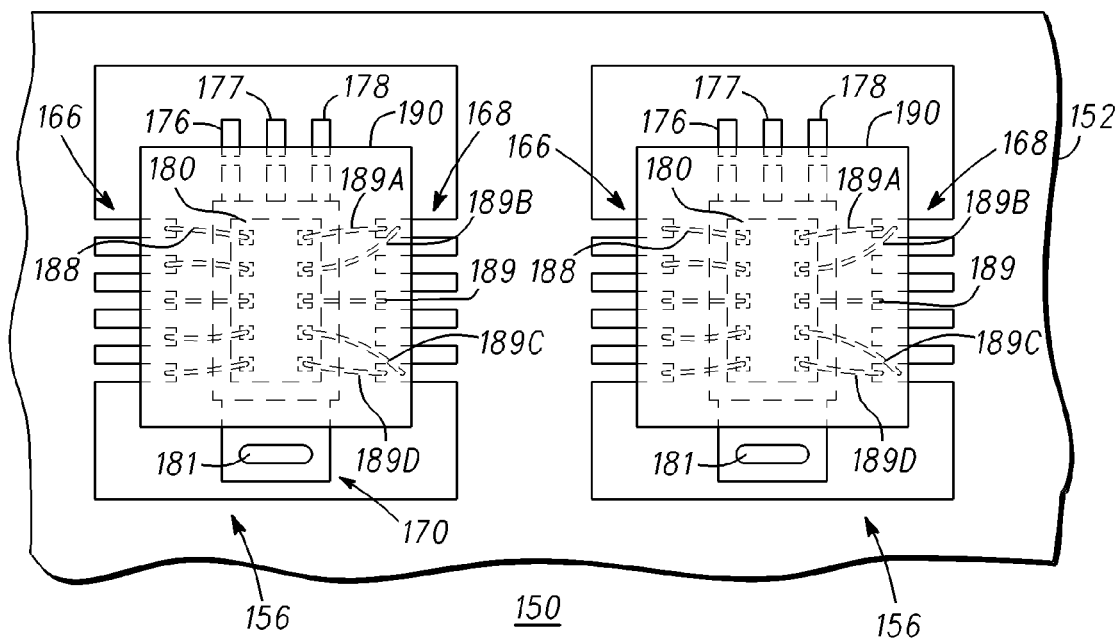
FIG. 11 is a top view of the semiconductor component of FIG. 9 during a later stage of manufacture.

Like leadframe 12, leadframe 152 typically includes a plurality of active areas from which semiconductor components are manufactured. After forming the bond wires, each active area is encapsulated in a mold compound that protects the semiconductor components from physical and environmental stresses. The individual semiconductor components are then singulated from the leadframe. FIG. 11 is a top view of semiconductor component 150 after molded semiconductor component 170, semiconductor die 180, bond pads 58, bond wires 188, 189, and 189A-189D, and portions of leadframe leads 166 and 168 have been encapsulated by a mold compound 190. These elements may be encapsulated in mold compound 190 using an injection molding technique. It should be noted that portions of semiconductor component 170, portions of leadframe leads 186 and 188, and wire bonds 189, 189A, and 189B that are encapsulated within mold compound 190 are shown as broken lines because they are hidden from view by mold compound 190.

Figure 12:
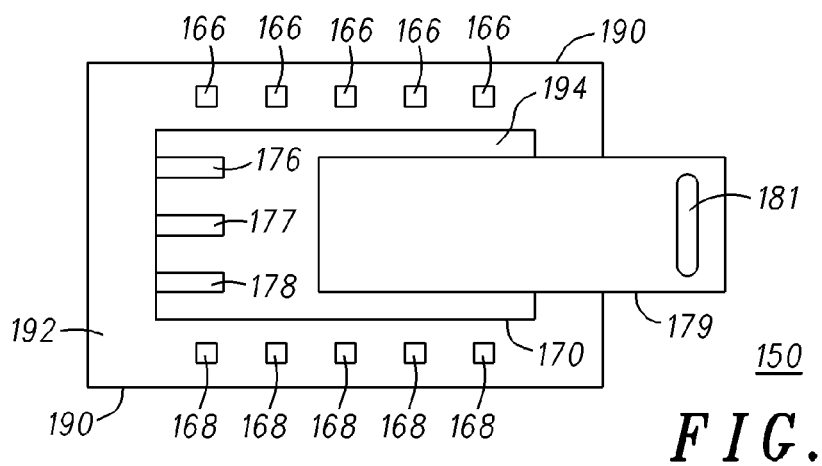
FIG. 12 is a bottom view the semiconductor component of FIG. 11 after singulation.

FIG. 12 is a bottom view of semiconductor component 150 after singulation. What is shown in FIG. 12 is bottom surface 192 of mold compound 190, leadframe leads 176, 177, 178, and 179, and bottom surface 194 of semiconductor component 170. Bottom surface 192 cooperates with bottom surface 194 to form the bottom surface of semiconductor component 150. Leadframe lead 176 serves as a source conductor, leadframe lead 177 serves as a gate conductor, and leadframe leads 178 and 179 serve as drain conductors. FIG. 12 further illustrates leadframe leads 166 and 168.

Figure 13:
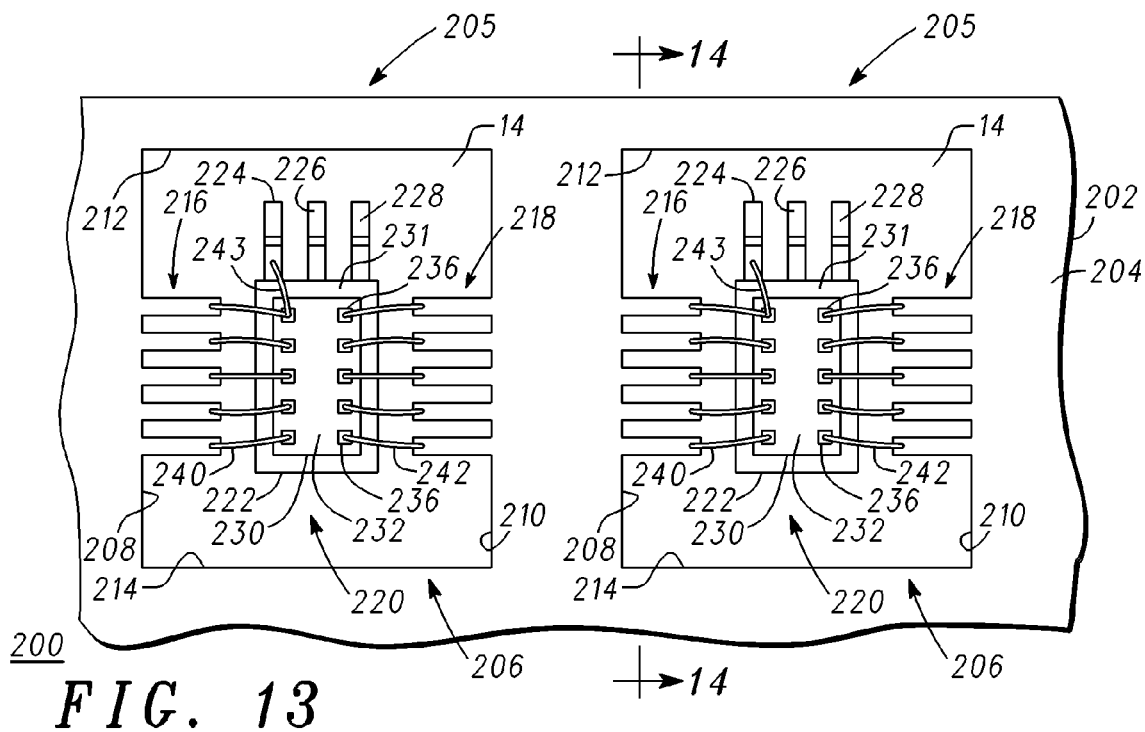
FIG. 13 is a top view of a semiconductor component during manufacture in accordance with another embodiment of the present invention.

FIG. 13 is a top view of a semiconductor component 200 during manufacture in accordance with another embodiment of the present invention. What is shown in FIG. 13 is a leadframe 202 mounted on adhesive tape 14. Leadframe 202 has a top surface 204, cavities 206 having opposing sides 208 and 210, and opposing sides 212 and 214. A plurality of leadframe leads 216 extends from side 208 and a plurality of leadframe leads 218 extends from side 210. It should be understood that the number of leadframe leads making up plurality of leadframe leads 216 and the number of leadframe leads making up plurality of leadframe leads 218 is not a limitation of the present invention. It should be further understood that leadframe 202 includes a plurality of active areas 205 from which semiconductor components are formed. By way of example, leadframe 202 is copper having a thickness ranging from about 5 mils (about 127 micrometers) to about 25 mils (about 635 micrometers). Techniques for forming leadframe leads are known to those skilled in the art.

A molded semiconductor component 220 is mounted on a portion of adhesive tape 14 exposed by cavities 206. More particularly, semiconductor component 220 is mounted between leadframe leads 216 and 218. In accordance with one embodiment, molded semiconductor component 220 comprises a semiconductor die mounted on a leadframe, wherein the semiconductor die and a portion of the leadframe are encapsulated within a mold compound 222. Leadframe leads 224, 226, and 228 extend from one side of mold compound 222.

Figure 14:
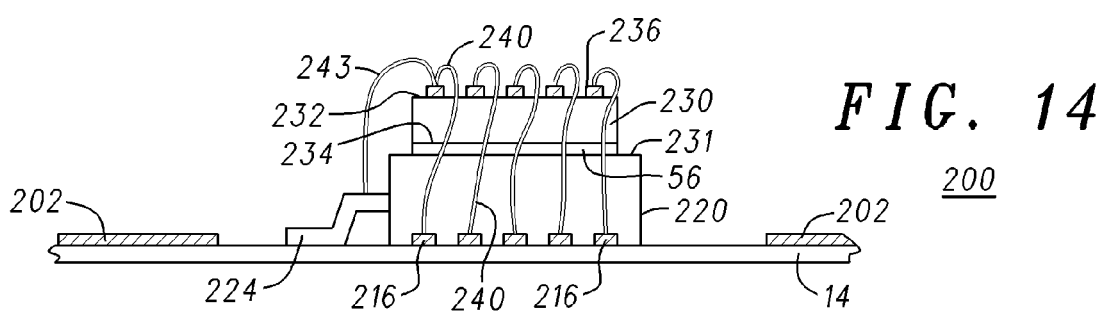
FIG. 14 is a cross-sectional view of the semiconductor component taken along section line 14-14 of FIG. 13.

A semiconductor die 230 having a top or active surface 232 and a bottom or mating surface 234 is attached to molded semiconductor component 220 through die attach material 56. It should be noted that FIG. 14 is a cross-sectional view taken along section line 14-14 of FIG. 13. A plurality of bond pads 236 is disposed on active surface 232. Mating surface 234 is placed in die attach material 56 which is disposed on a top surface 231 of molded semiconductor component 230. Die attach material 56 is then cured.

Bond wires 240 connect leadframe leads 216 to corresponding bond pads 236 and bond wires 242 connect leadframe leads 218 to corresponding bond pads 236. Preferably, a single bond wire connects a leadframe lead to a corresponding bond pad. However, this is not a limitation of the present invention. For example, multiple bond wires may connect two or more bond pads to a single leadframe lead. In addition, a bond wire 243 connects a bond pad 236 to leadframe lead 224.

Figure 15:
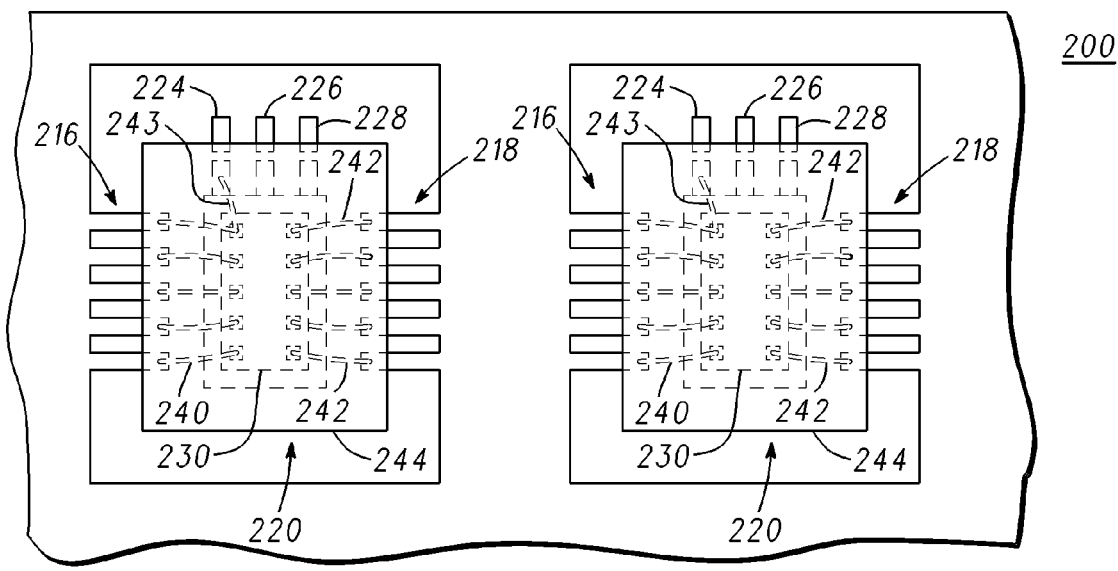
FIG. 15 is a top view of the semiconductor component of FIG. 14 during a later stage of manufacture.

Like leadframe 12, leadframe 202 typically includes a plurality of active areas from which semiconductor components are manufactured. After forming the bond wires, each active area is encapsulated in a mold compound that protects the semiconductor components from physical and environmental stresses. The individual semiconductor components are then singulated from the leadframe. FIG. 15 is a top view of semiconductor component 200 after molded semiconductor component 220, semiconductor die 230, bond pads 236, and bond wires 240, 242, and 243, and portions of leadframe leads 224, 226, and 228 have been encapsulated by a mold compound 244. These elements may be encapsulated in mold compound 244 using an injection molding technique. It should be noted that portions of semiconductor component 230, portions of leadframe leads 216, 218, 224, 226, and 228, and wire bonds 240 and 242 that are encapsulated within mold compound 244 are shown as broken lines because they are hidden from view by mold compound 244.

Figure 16:
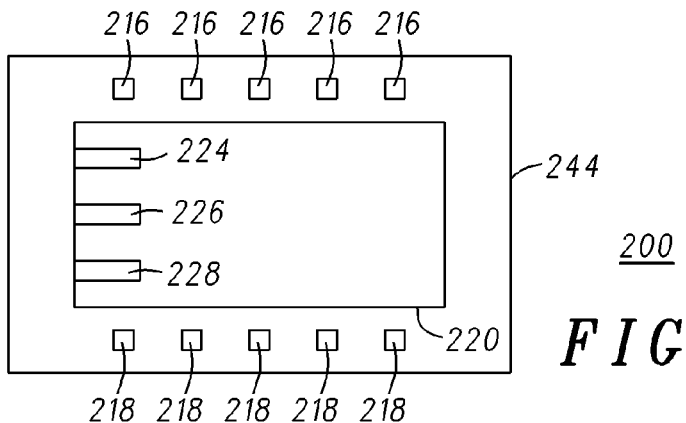
FIG. 16 is a bottom view of the semiconductor component of FIG. 15 after singulation.

FIG. 16 is a bottom view of semiconductor component 200 after singulation. What is shown in FIG. 16 is a bottom surface of molded semiconductor component 220, leadframe leads 216, 224, 226, and 228, and a bottom surface of mold compound 244. Leadframe lead 224 serves as a source conductor, leadframe lead 226 serves as a gate conductor, and leadframe lead 228 serves as a drain conductor.

Figure 17:
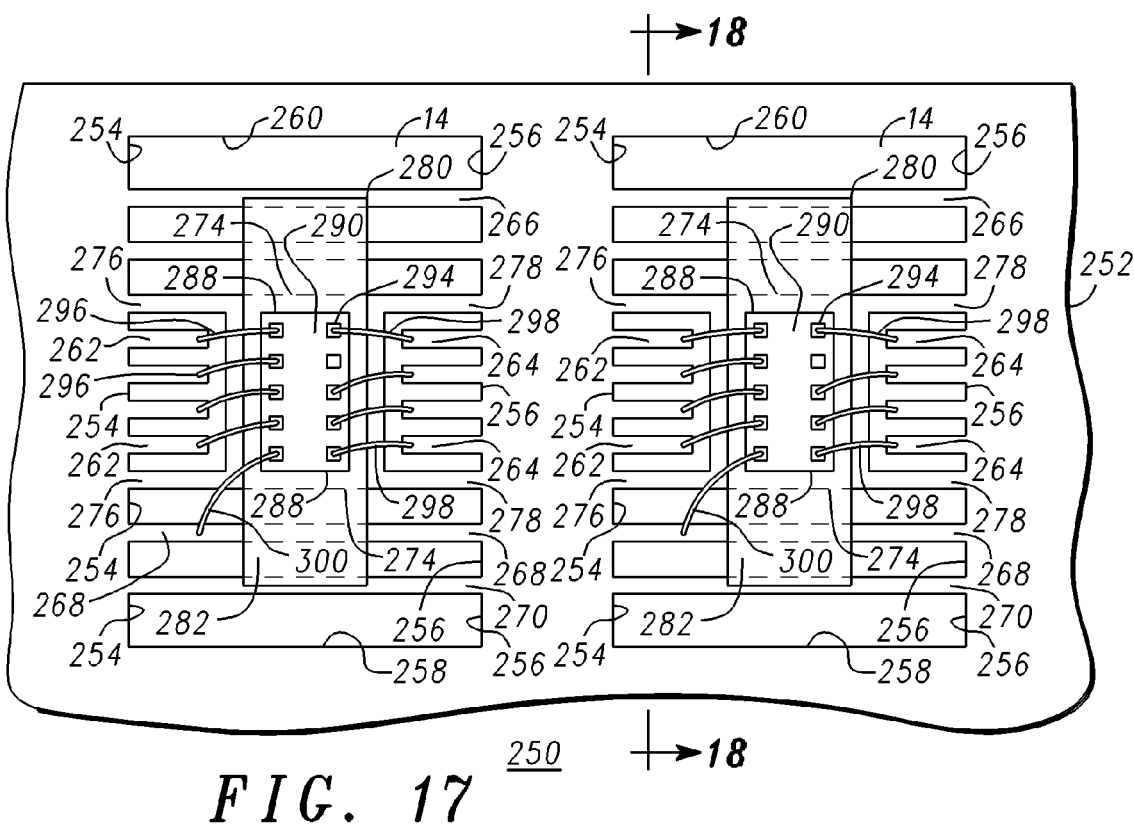
FIG. 17 is a top view of a semiconductor component during manufacture in accordance with another embodiment of the present invention.

FIG. 17 is a top view of a semiconductor component 250 during manufacture in accordance with another embodiment of the present invention. What is shown in FIG. 17 is leadframe 252 mounted on an adhesive tape 14. Leadframe 252 has openings having opposing sides 254 and 256 and openings having opposing sides 258 and 260. Leadframe 252 has leadframe leads 262 and 264 extending from sides 254 and 256, respectively, and leadframe lead structures 266, 268, and 270 extending from side 254 to side 256. In addition, leadframe 252 includes a semiconductor component attach structure or flag 274 connected to side 254 by tabs 276 and connected to side 256 by tabs 278. Leadframes, such as leadframe 252, and their manufacture have been described with reference to FIG. 1. A molded semiconductor component 280 is coupled to each flag 274 using a die attach material such as, for example, die attach material 56 or solder. Each molded semiconductor component 280 is also connected to leadframe lead structures 266, 268, and 270. Molded semiconductor component 280 may be comprised of a semiconductor die mounted on a leadframe, wherein the semiconductor die and a portion of the leadframe are encapsulated within a mold compound. Like molded semiconductor component 34, molded semiconductor component 280 includes a top surface 282, a bottom surface 284, and conductors exposed through bottom surface 284.

Figure 18:
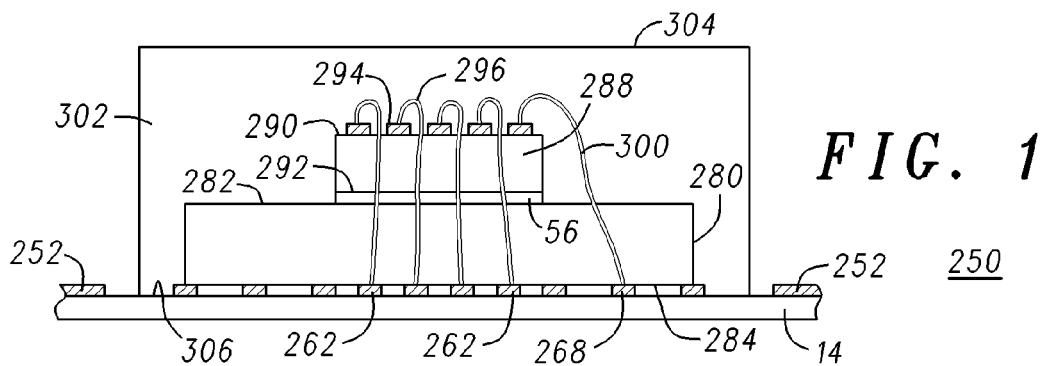
FIG. 18 is a cross-sectional view of the semiconductor component taken along section line 18-18 of FIG. 17.
Figure 19:
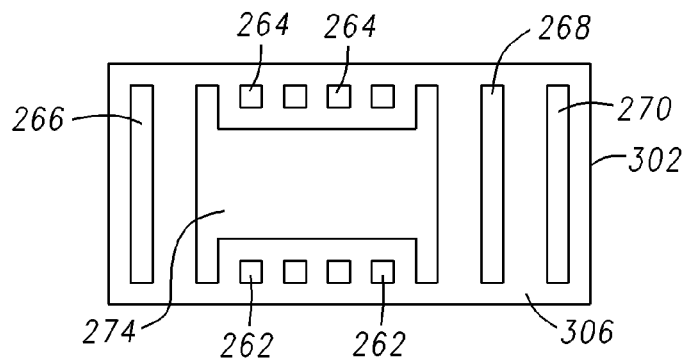
FIG. 19 is a bottom view the semiconductor component of FIG. 18 after singulation.

With reference to FIGS. 17, 18 and 19, a semiconductor die 288 having a top or active surface 290 and a bottom or mating surface 292 is attached to molded semiconductor component 280 through a die attach material 56. It should be noted that FIG. 18 is a cross-sectional view taken along section line 18-18 of FIG. 17. A plurality of bond pads 294 is disposed on active surface 290. Mating surface 292 is placed in die attach material 56 which is disposed on surface 282 of molded semiconductor component 280. Die attach material 56 is then cured.

Bond wires 296 and 298 connect leadframe leads 262 and 264, respectively, to corresponding bond pads 294. Bond wires 300 connect corresponding bond pads 294 to leadframe lead structures 268. Preferably, a single bond wire connects a leadframe lead to a corresponding bond pad. However, this is not a limitation of the present invention. For example, one or more bond pads may be connected to a single leadframe lead. Bond wires are also referred to as wire bonds. Techniques for forming bond wires are known to those skilled in the art.

Leadframe 252 to which molded semiconductor components 280 and semiconductor chips 288 are mounted is placed in a transfer mold assembly and encapsulated by a mold compound 302 to form an encapsulated semiconductor component having a top surface 304 and a bottom surface 306.

Adhesive tape 14 is removed and leadframe 252 having molded semiconductor components 280, semiconductor chips 288, and mold compound 302 is singulated into molded semiconductor components 250. FIG. 19 is a bottom view of a singulated molded semiconductor component 250 and illustrates flag 274, bottom surface 306, the portions of leadframe leads 262 and 264, and the portions of leadframe lead structures 266, 268, and 270 that remain after removal of adhesive tape 14 and singulation.

Figure 20:
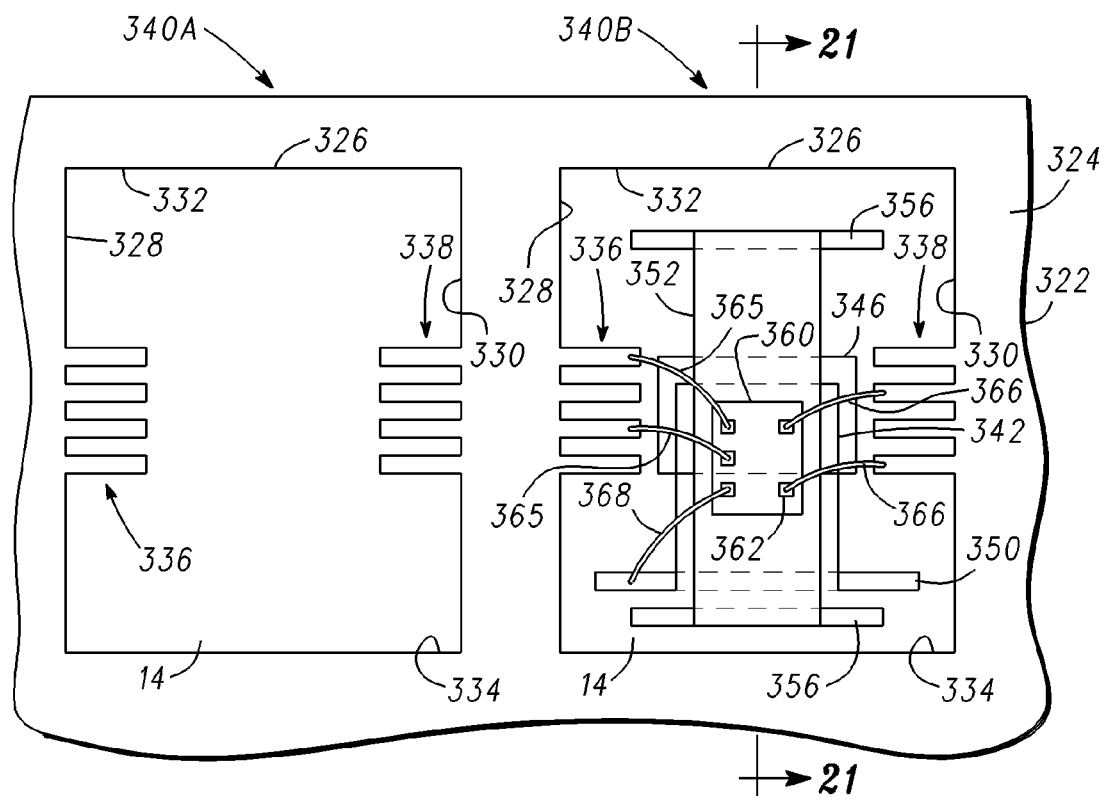
FIG. 20 is a top view of a semiconductor component during manufacture in accordance with another embodiment of the present invention.
Figure 21:
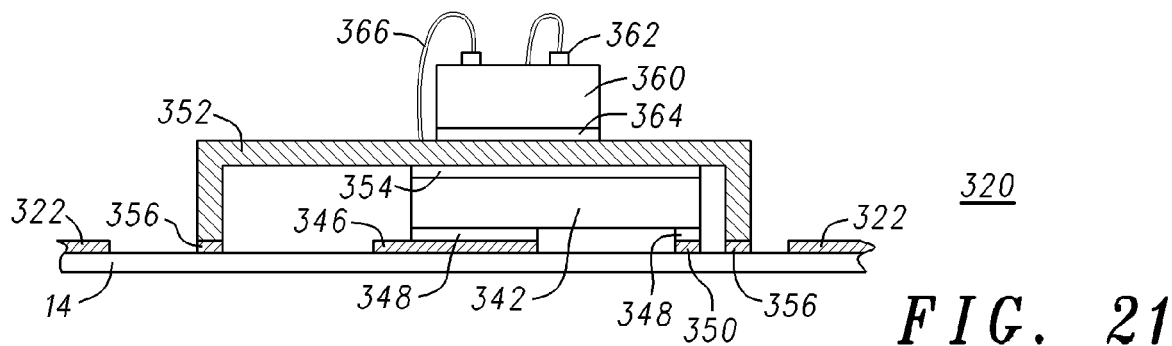
FIG. 21 is a cross-sectional view of the semiconductor component taken along section line 21-21 of FIG. 20.

FIGS. 20 and 21 illustrate a top view and a cross-sectional view, respectively, of a semiconductor component 320 during manufacture in accordance with another embodiment of the present invention. What is shown in FIG. 20 is a leadframe 322 mounted on adhesive tape 14. Leadframe 322 has a top surface 324, cavities 326 having opposing sides 328 and 330, and opposing sides 332 and 334. A plurality of leadframe leads 336 extend from side 328 and a plurality of leadframe leads 338 extend from side 330. Cavities 326 expose portions of adhesive tape 14. It should be understood that the number of leadframe leads making up plurality of leadframe leads 336 and the number of leadframe leads making up leadframe leads 338 are not limitations of the present invention. It should be further understood that leadframe 322 includes a plurality of active areas from which semiconductor components are formed. Preferably the active areas are identical and can be referenced by a single reference character. For the sake of clarity the active areas are identified by reference characters 340A and 340B. By way of example, leadframe 320 is copper having a thickness ranging from about 5 mils (about 127 micrometers) to about 25 mils (about 635 micrometers). Techniques for forming leadframe leads are known to those skilled in the art.

A semiconductor component 342 is mounted on each portion of adhesive tape 14 exposed by cavities 326. To further illustrate the structure of leadframe 322, a semiconductor component is not shown in active area 340A. Semiconductor component 342 comprises a semiconductor die coupled to a source lead 346 through a die attach material 348 and a gate lead 350 through die attach material 348. An electrically conductive clip 352 is coupled to the semiconductor die via a thermally conductive epoxy 354 and to drain leads 356. Alternatively, conductive clip 352 may be coupled to the semiconductor die via solder. A semiconductor die 360 having bond pads 362 disposed on a top surface is coupled to clip 352 via a die attach material 364, solder or epoxy.

Bond wires 365 connect leadframe leads 336 to corresponding bond pads 362 and bond wires 366 connect leadframe leads 338 to corresponding bond pads 362. Preferably, a single bond wire connects a leadframe lead to a corresponding bond pad. However, this is not a limitation of the present invention. For example, multiple bond wires may connect two or more bond pads to a single leadframe lead. In addition, a bond wire 368 connects a bond pad 362 to gate lead 350.

Figure 22:
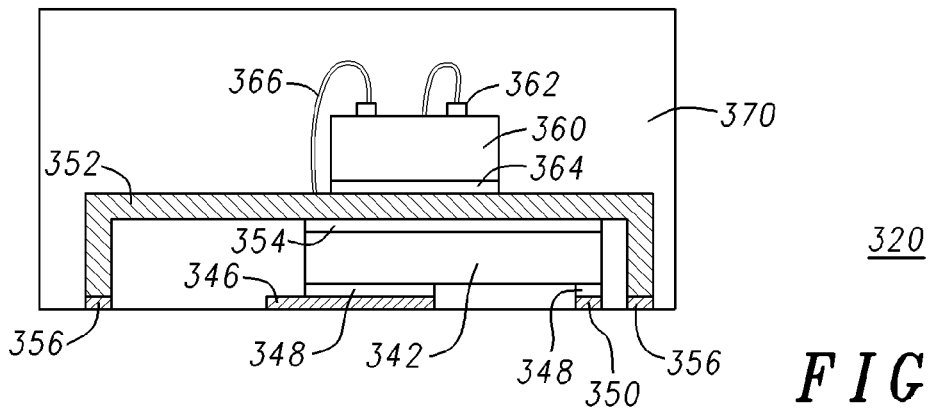
FIG. 22 is a cross-sectional view the semiconductor component of FIG. 21 after encapsulation and singulation.

Like leadframe 12, leadframe 322 typically includes a plurality of active areas from which semiconductor components are manufactured. After forming the bond wires, each active area is encapsulated in a mold compound that protects the semiconductor components from physical and environmental stresses. The individual semiconductor components are then singulated from the leadframe. FIG. 22 is cross-sectional view of semiconductor component 320 after semiconductor component 342 and portions of leadframe 322 have been encapsulated by a mold compound 370 and singulated. In addition, adhesive tape 14 has been removed. These elements may be encapsulated in mold compound 370 using a transfer molding technique.

Figure 23:
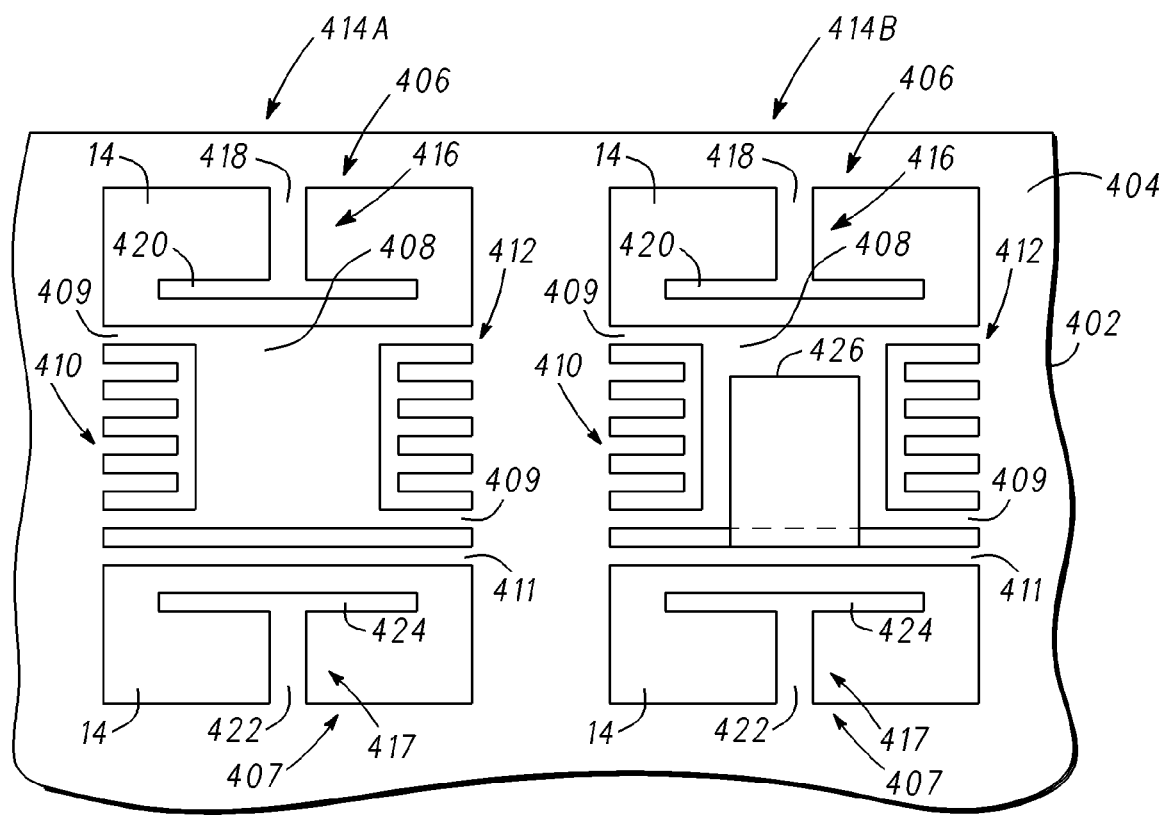
FIG. 23 is a top view of a semiconductor component during manufacture in accordance with another embodiment of the present invention.

FIG. 23 is a top view of a semiconductor component 400 during manufacture in accordance with another embodiment of the present invention. What is shown in FIG. 23 is a leadframe 402 mounted on adhesive tape 14. Leadframe 402 has a top surface 404, cavities 406 and 407, a flag 408, a plurality of leadframe leads 410 and a plurality of leadframe leads 412. Cavities 406 and 407 expose portions of adhesive tape 14. Flag 408 is connected to leadframe 402 by tabs 409. It should be understood that the numbers of leadframe leads making up plurality of leadframe leads 410 and 412 are not limitations of the present invention. Leadframe leads 416 extend into cavities 406 and leadframe leads 417 extend into cavities 407. Each leadframe lead 416 has a tab portion 418 and a bonding portion 420. Similarly, each leadframe lead 417 has a tab portion 422 and a bonding portion 424. Leadframe 402 includes gate leads 411 adjacent to openings 407. It should be further understood that leadframe 402 includes a plurality of active areas from which semiconductor components are formed. Preferably the active areas are identical and can be referenced by a single reference character. However, for the sake of clarity the active areas are identified by reference characters 414A and 414B. By way of example, leadframe 402 is copper having a thickness ranging from about 5 mils (about 127 micrometers) to about 25 mils (about 635 micrometers). Techniques for forming leadframe leads are known to those skilled in the art.

A semiconductor die 426 is coupled to flag 408 in active area 414B. A source conductor of semiconductor die 426 is coupled to flag 408 via an electrically and thermally conductive epoxy 429 and a gate conductor is coupled to gate lead 411 via thermally and electrically conductive epoxy 429 (shown in FIG. 25). To further illustrate the structure of leadframe 402, a semiconductor component is not shown in active area 414A. A source region of semiconductor die 426 is coupled to flag 408 via an electrically and thermally conductive epoxy 427 and a gate region of semiconductor die 426 is coupled to gate lead 411 via electrically and thermally conductive epoxy 427.

Figure 24:
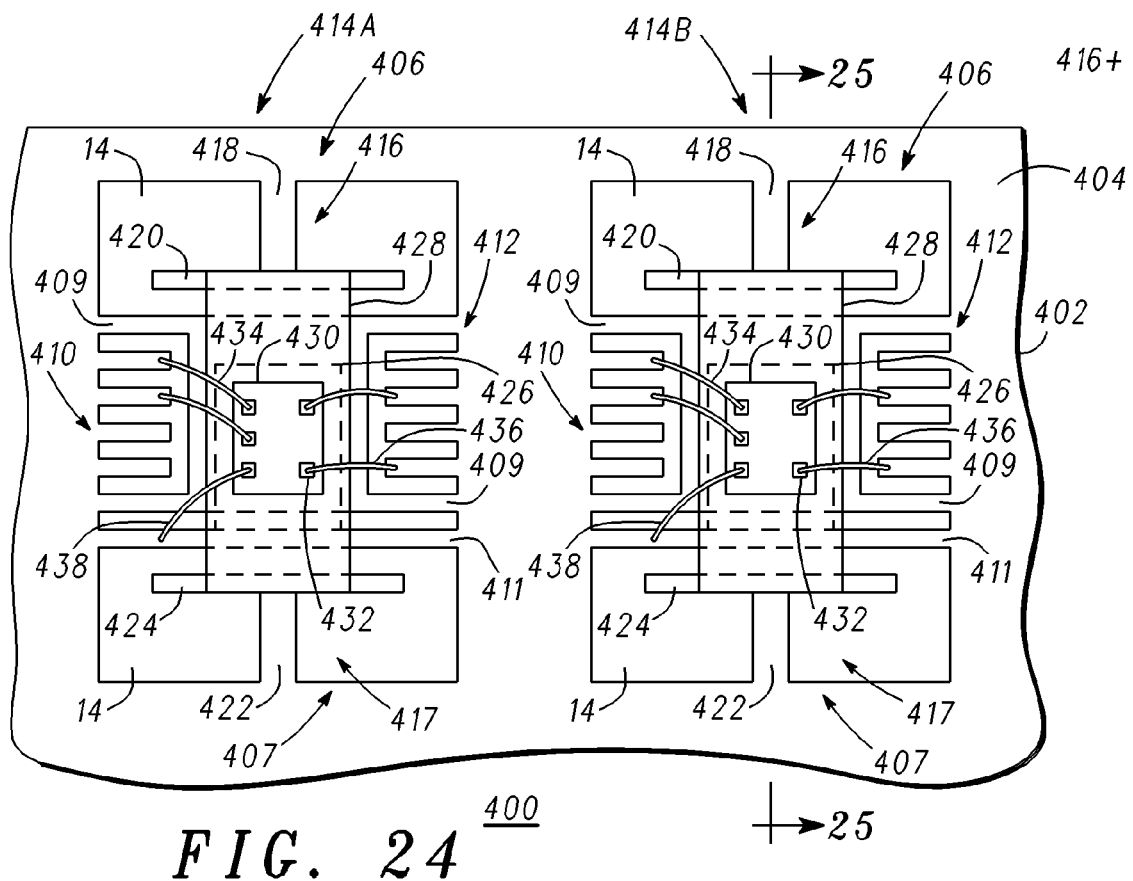
FIG. 24 is a top view of the semiconductor component of FIG. 22 at a later stage of manufacture.

Referring now to FIG. 24, an electrically conductive clip 428 is coupled to a drain region of semiconductor die 426 via a thermally conductive epoxy 427 (shown in FIG. 25) and to leadframe leads 416 and 417. Alternatively, electrically conductive clip 428 is coupled to semiconductor die 426 by solder. A semiconductor die 430 having bond pads 432 disposed on a top surface is coupled to conductive clip 428 via a die attach material 433. It should be noted that FIG. 24 illustrates semiconductor component 426, clip 428, and semiconductor die 430 mounted to active areas 414A and 414B.

Bond wires 434 connect leadframe leads 410 to corresponding bond pads 432 and bond wires 436 connect leadframe leads 412 to corresponding bond pads 432. Preferably, a single bond wire connects a leadframe lead to a corresponding bond pad. However, this is not a limitation of the present invention. For example, multiple bond wires may connect two or more bond pads to a single leadframe lead. In addition, a bond wire 438 connects a bond pad 432 to gate lead 411.

Figure 25:
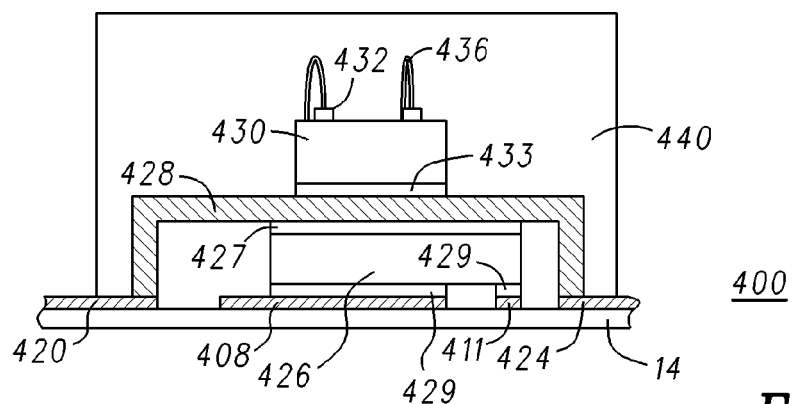
FIG. 25 is a cross-sectional view of the semiconductor component taken along section line 25-25 of FIG. 24 after encapsulation.
Figure 26:
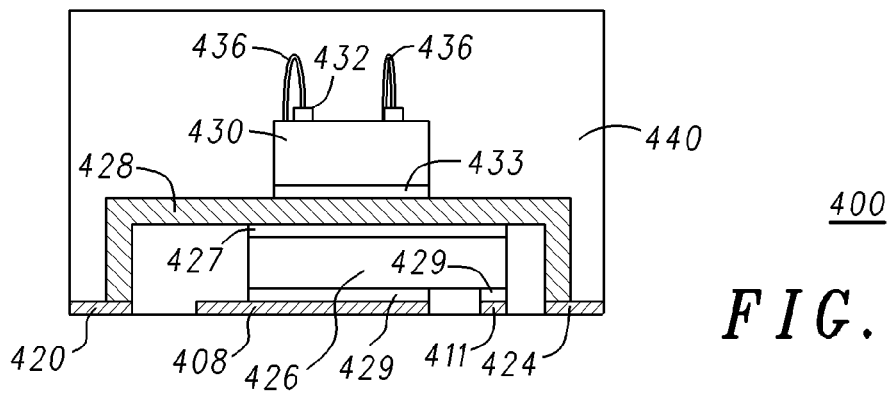
FIG. 26 is a cross-sectional view the semiconductor component of FIG. 25 after encapsulation.

Like leadframe 12, leadframe 402 typically includes a plurality of active areas from which semiconductor components are manufactured. After forming the bond wires, each active area is encapsulated in a mold compound that protects the semiconductor components from physical and environmental stresses. The individual semiconductor components are then singulated from the leadframe. FIG. 25 is cross-sectional view of semiconductor component 400 after source lead 408, gate lead 411, drain leads 420 and 424, semiconductor component 426, conductive clip 428, and bond wires 434, 436, and 438 have been encapsulated by a mold compound 440. FIG. 26 is a cross-sectional view of semiconductor component 400 after adhesive tape 14 has been removed and leadframe 402 has been singulated.

Figure 27:
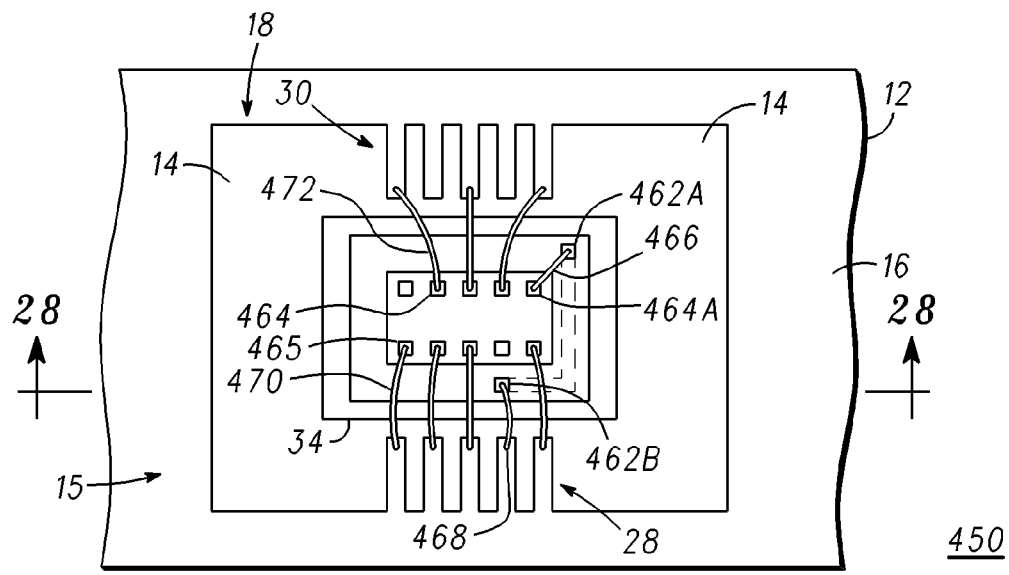
FIG. 27 is a top view of a semiconductor component during manufacture in accordance with another embodiment of the present invention.

FIG. 27 is a top view of a semiconductor component 450 during manufacture in accordance with another embodiment of the present invention. What is shown in FIG. 27 is a leadframe 12 mounted on an adhesive tape 14. Leadframe 12 and adhesive tape 14 have been described with reference to FIG. 1. It should be further understood that leadframe 12 includes a plurality of active areas from which semiconductor components are formed but that FIG. 27 illustrates a single active area 15.

Molded semiconductor components are mounted on portions of adhesive tape 14 that are exposed by cavity 18. More particularly, a semiconductor component 34 is mounted between leadframe leads 28 and 30 in active area 15. In accordance with one embodiment, semiconductor component 34 is comprised of a semiconductor die mounted on a leadframe, wherein the semiconductor die and a portion of the leadframe are encapsulated within a mold compound. Semiconductor component 34 has been described with reference to FIG. 1.

Figure 28:
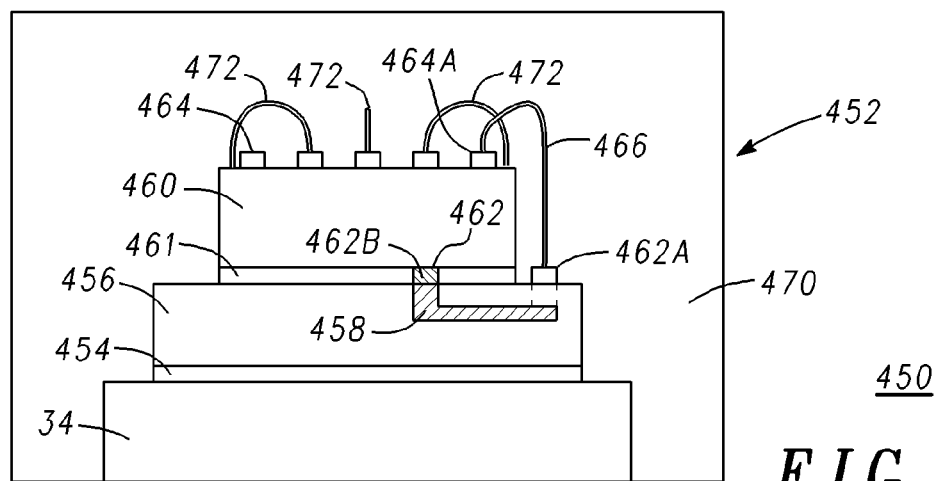
FIG. 28 is a cross-sectional view of the semiconductor component taken along section line 28-28 of FIG. 27.

With reference to FIGS. 27 and 28, a semiconductor structure 452 is attached to molded semiconductor component 34 through an epoxy 454. Semiconductor structure 452 comprises a circuit board 456 having conductive traces such as conductive trace 458. Semiconductor structure 452 further includes a semiconductor die 460 mounted to circuit board 456 through a die attach material 461. Bond pads 462A and 462B are formed on circuit board 456 and bond pads 464 and 464A are formed on semiconductor die 460. The number of bond pads formed on circuit board 456 and the number of bond pads formed on semiconductor die 460 are not limitations of the present invention. A bond pad 464A disposed on semiconductor die 460 is coupled to a bond pad 462A disposed on circuit board 456 by a wire bond 466. Bond pad 462A is coupled to bond pad 462B through conductive trace 458 and bond pad 462B is coupled to one or more leadframe leads 28 by a wire bond 468. Bond pads 465 are coupled to corresponding leadframe leads 28 by wire bonds 470 and bond pads 464 are coupled to corresponding leadframe leads 30 by wire bonds 472. Semiconductor die 460, circuit board 456, and semiconductor component 34 are encapsulated within a mold compound 470, adhesive tape 14 is removed, and leadframe 12 is singulated. An advantage of mounting a semiconductor die to a circuit board and mounting the circuit board to a semiconductor component is that the pin out can be redistributed without redesigning the semiconductor die.

By now it should be appreciated that a semiconductor component comprising two or more semiconductor die and a method for manufacturing the semiconductor component have been provided. An advantage of mounting the semiconductor die to an encapsulated semiconductor component is that the encapsulated semiconductor component can be electrically tested before incorporation into the semiconductor component package. In addition, mounting the semiconductor die to the encapsulated semiconductor component precludes die-stacking issues such as low loop wire bonding, wire bonding on overhanging semiconductor die, in-board wire bonding, or the like. Packaging semiconductor die in accordance with the present invention allows placing controller semiconductor die and driver semiconductor die in a single package with a Field Effect Transistor. Another advantage is that embodiments in accordance with the present invention allow the use of Input-Output ("I/O") leads of a packaged device as the external I/O of a Multi-Chip Module thereby precluding the need for an internal circuit board with added traces.

Although certain preferred embodiments and methods have been disclosed herein, it will be apparent from the foregoing disclosure to those skilled in the art that variations and modifications of such embodiments and methods may be made without departing from the spirit and scope of the invention. For example, one or more passive semiconductor devices can be mounted to the encapsulated semiconductor die. It is intended that the invention shall be limited only to the extent required by the appended claims and the rules and principles of applicable law.

What is claimed is:

1. A method for manufacturing a semiconductor component, comprising:
    providing a packaged semiconductor die which includes a first semiconductor die mounted to a first support and a first protective material covering a portion of the first semiconductor die and a portion of the first support;
    mounting a second support to a temporary support;
    mounting the packaged semiconductor die to the temporary support; and
    mounting a second semiconductor die to the packaged semiconductor die.

2. The method of claim 1, wherein the second semiconductor die has one or more bond pads.

3. The method of claim 2, further including electrically coupling a first bond pad of the one or more bond pads to the first support.

4. The method of claim 1, further including coupling a second bond pad of the one or more bond pads to the second support.

5. The method of claim 1, further including coupling the first semiconductor die to the second support.

6. The method of claim 1, wherein the temporary support is a polymeric material.

7. The method of claim 1, wherein the second support is a leadframe.

8. A method for manufacturing a semiconductor component, comprising:
    mounting a support on a temporary support;
    providing a packaged semiconductor die which includes a first semiconductor die mounted to a first support and a first protective material covering a portion of the first semiconductor die and a portion of the first support;
    mounting the packaged semiconductor die to the temporary support;
    mounting a second semiconductor die over the packaged semiconductor die; and
    forming a protective material over a portion of the second semiconductor die and the packaged semiconductor die.

9. The method of claim 8, wherein mounting the support on the temporary support comprises mounting a first leadframe on the temporary support and further including coupling the second semiconductor die to a first portion of the first leadframe.

10. The method of claim 9, further including coupling the packaged semiconductor die to a second portion of the first leadframe.

11. The method of claim 8, wherein the first contact structure comprises a portion of a second leadframe.

12. The method of claim 8, wherein the material and the protective material comprise a mold compound.

13. The method of claim 9, further including mounting a third semiconductor die to the packaged semiconductor die and wherein forming the protective material includes forming the protective material over a portion of the third semiconductor die.

14. The method of claim 13, further including coupling the third semiconductor die to a third portion of the first leadframe.

15. The method of claim 8, wherein the material comprises an electrically conductive clip.

16. The method of claim 8, wherein mounting a second semiconductor die over the packaged semiconductor die comprises:
    mounting the second semiconductor die to a substrate; and
    mounting the substrate to the packaged semiconductor die.

17. The method of claim 16, wherein the substrate is a printed circuit board.

18. A semiconductor component, comprising:
    a support mounted on a temporary support;
    a packaged semiconductor die which includes a first semiconductor die mounted to a first support and a first protective material covering a portion of the first semiconductor die and a portion of the first support mounted on the temporary support;
    a second semiconductor die over the material; and
    a protective material over a portion of the second semiconductor die and the first protective material.

19. The semiconductor component of claim 18, wherein a packaging material of the packaged semiconductor die and a material of the protective material are mold compounds.

20. The method of claim 18, wherein the support is a leadframe.

* * * * *